United States Patent
Sun et al.

(10) Patent No.: US 6,171,917 B1
(45) Date of Patent: Jan. 9, 2001

(54) TRANSISTOR SIDEWALL SPACERS COMPOSED OF SILICON NITRIDE CVD DEPOSITED FROM A HIGH DENSITY PLASMA SOURCE

(75) Inventors: Sey-Ping Sun, Austin; Thomas E. Spikes, Round Rock; Fred N. Hause, Austin, all of TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/048,192

(22) Filed: Mar. 25, 1998

(51) Int. Cl.[7] .................... H01L 21/336; H01L 21/31
(52) U.S. Cl. .................. 438/305; 438/303; 438/791; 438/792
(58) Field of Search .................. 438/303, 305, 438/791, 792

(56) References Cited

U.S. PATENT DOCUMENTS

| | | | |
|---|---|---|---|
| 5,089,865 | * 2/1992 | Mitsui et al. | 357/23.4 |
| 5,324,974 | 6/1994 | Liao | 257/344 |
| 5,334,870 | 8/1994 | Katada et al. | 156/345 |
| 5,346,578 | 9/1994 | Benzing et al. | 156/345 |
| 5,405,480 | * 4/1995 | Benzig et al. | 156/345 |
| 5,621,241 | 4/1997 | Jain | 257/632 |
| 5,641,480 | 6/1997 | Elwell et al. | 427/575 |
| 5,641,546 | * 6/1997 | Elwell et al. | 427/575 |
| 5,648,284 | 7/1997 | Kusuroki et al. | 437/40 |
| 5,719,425 | 2/1998 | Akram et al. | 257/344 |
| 5,780,896 | 7/1998 | Ono | 257/344 |
| 5,818,092 | 10/1998 | Bai et al. | 257/388 |
| 5,847,428 | 12/1998 | Fulford, Jr. et al. | 257/344 |
| 5,858,848 | * 1/1999 | Gardner et al. | 438/305 |
| 5,895,955 | 4/1999 | Gardner et al. | 257/336 |
| 5,905,293 | 5/1999 | Jeng et al. | 257/408 |
| 5,937,315 | 8/1999 | Xiang et al. | 438/486 |

OTHER PUBLICATIONS

Wolf, "Silicon Processing For the VLSI Era, vol. 3: the Submicron MOSFET," Lattice Press, Sunset Beach, California, pp. 660–661, No Month.

Tuszewski, et al, "Characterization of a Low Frequency Inductively Coupled Plasma Source," Novelius Technical Paper, Journal of Vacuum Science & Technology, Rev. A, vol. 14, Issue No. 3, May 1996 pp. 1096–1101.

* cited by examiner

Primary Examiner—John F. Niebling
Assistant Examiner—Alexander G. Ghyka
(74) Attorney, Agent, or Firm—Kevin L. Daffer; Conley, Rose & Tayon (57) ABSTRACT

A method is provided for forming high quality nitride sidewall spacers laterally adjacent to the opposed sidewall surfaces of a gate conductor dielectrically spaced above a semiconductor substrate. In an embodiment, a polysilicon gate conductor is provided which is arranged between a pair of opposed sidewall surfaces upon a gate dielectric. The gate dielectric is arranged upon a semiconductor substrate. Nitride is deposited from a high density plasma source across exposed surfaces of the substrate and the gate conductor. The high density plasma source may be generated within an ECR or ICP reactor containing a gas bearing $N_2$ and $SiH_4$. The energy and flux of electrons, ions, and radicals within the plasma are strictly controlled by the magnetic field such that a substantially stoichiometric and contaminant-free nitride is deposited upon the semiconductor topography. Thereafter, the nitride is anisotropically etched so as to form nitride spacers laterally adjacent the sidewall surfaces of the gate conductor.

13 Claims, 6 Drawing Sheets

TRANSISTOR SIDEWALL SPACERS COMPOSED OF SILICON NITRIDE CVD DEPOSITED FROM A HIGH DENSITY PLASMA SOURCE

BACKGROUND OF THE INVENTION

1. Field of the Invention

This invention relates to integrated circuit fabrication and, more particularly, to forming transistor sidewall spacers from silicon nitride which has been deposited from a high density plasma source, thereby enhancing the properties of the integrated circuit employing the transistor.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Operating transistors which have heavily doped source/drain regions arranged directly adjacent the gate conductor often experience a problem known as hot carrier injection ("HCI"). HCI is a phenomena by which the kinetic energy of the charged carriers (holes or electrons) is increased as they are accelerated through large potential gradients, causing the charged carriers to become injected into and trapped within the gate oxide. The greatest potential gradient, often referred to as the maximum electric field ("Em") occurs near the drain during saturated operation. As a result of carrier entrapment within the gate oxide, a net negative charge density forms in the gate oxide. The trapped charge can accumulate with time, resulting in a positive threshold shift in a NMOS transistor, or a negative threshold shift in a PMOS transistor.

To overcome the problems of sub-threshold current and threshold shift resulting from HCI, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier dopant self-aligned to the gate conductor on which two sidewall spacers have been formed. The purpose of the first implant dose is to produce a lightly doped section within the active area (hereinafter "junction") at the gate edge near the channel. The second implant dose is spaced from the channel a distance dictated by the thickness of the sidewall spacer. The second implant dose forms a heavily doped source/drain region within the junction laterally outside the LDD area. A dopant gradient ("graded junction") results in which the dopant concentration within the junction decreases in a lateral direction toward the channel.

Formation of sidewall spacers adjacent to the gate conductor typically involves chemical vapor deposition ("CVD") of silicon dioxide ("oxide") from a low density plasma source created within a reaction chamber. The plasma is generated by applying a radio-frequency ("RF") electric field to a low pressure gas containing reactant molecules, e.g., silane and oxygen-containing species. The RF field causes electrons to be stripped from their respective atoms and gain kinetic energy. The high-energy electrons collide with gas molecules, thereby causing dissociation and ionization of the, reactant molecules. The energetic species, primarily radicals, that form are then adsorbed on the surface of the semiconductor topography which is positioned within the reaction chamber. While upon the topological surface, they diffuse to stable sites where they react with other adsorbed species to form oxide as well as other molecules.

The RF power is applied at a relatively low frequency of approximately 450 KHZ to 13.5 MHz. Consequently, the degree of ionization is extremely low, and a low density plasma ($10^8$ to $10^{10}$ ions/cm$^3$) is generated which contains only a fraction of excited neutral atoms. It is postulated that the number of oxygen radicals produced may not be sufficient to combine with all of the silicon radicals produced. The highly reactive silicon radicals that become adsorbed on the semiconductor topography thus may combine with atoms other than oxygen. The resulting deposited oxide is non-stoichiometric and may contain by-products such as hydrogen which are bonded to the silicon. The relatively weak Si—H bonds can be easily broken in subsequent annealing steps, allowing hydrogen atoms within the oxide spacers to migrate into the gate conductor, the gate oxide, the junctions, and/or the channel of the transistor. Hydrogen atoms positioned within these areas of the transistor can cause, for example, the threshold voltage of the transistor to shift undesirably from its design specification.

Using an RF field to create the plasma can also lead to surface damage of the semiconductor topography. The motion of the excited species within the plasma is not strictly controlled. The ions of the plasma can bombard the semiconductor topography at a force sufficient to damage portions of the substrate and the gate conductor. Moreover, the highly reactive radicals that form can collide with gas molecules and undergo a homogeneous gas-phase nucleation to form relatively course particulates which can contaminate the deposited oxide. Such contaminates can lead to outgassing, cracking, or peeling when subjected to changing temperature conditions during later processing steps. The contaminates can also cause threshold shifts in the transistor-containing oxide spacers formed from the CVD deposited oxide.

Integrated circuit formation involves electrical linkage of various active devices, i.e., transistors. Contacts are formed through an interlevel dielectric down to the electrically active areas, and multiple levels of dielectrically isolated interconnect are routed to the contacts. With the desire to build faster, more complex integrated circuits, the use of local interconnect which extend over relatively short routing distances has become increasingly popular. Local interconnect can be used to provide coupling between a gate of a MOS transistor and, e.g., a source or drain junction of that transistor or of another transistor. Formation of a contact coupled to the gate conductor involves etching an opening vertically through an oxide interlevel dielectric down to the gate conductor using a conventional optical lithography technique and an etch technique highly selective to the oxide interlevel dielectric. Unfortunately, misalignment of the photoresist masking layer may occur during optical lithography, permitting ion bombardment of the oxide sidewall spacers during the etch step. Substantial misalignment and/or bombardment of the spacers will remove them from between the gate conductor and the source/drain junction. Thus, when a conductive material, such as tungsten is deposited into the contact opening, it may become arranged laterally adjacent to the gate conductor in regions where the sidewall spacers have been removed. This configuration of the conductive material may provide for unwanted capacitive coupling or electrical linkage between the gate conductor and the source/drain regions.

It is therefore desirable to devise a method for forming sidewall spacers comprising a high quality dielectric laterally adjacent to the gate conductor of a transistor. In other words, the dielectric from which the spacers are formed should be stoichiometric. It is necessary that the sidewall spacers contain no contaminates which could be detrimental to the operation of the transistor. The sidewall spacers must effectively prevent electrical shorting between the gate conductor and adjacent junctions. Thus, it would also be beneficial to form sidewall spacers which are substantially resistant to attack by etchants which are highly selective to oxide.

SUMMARY OF THE INVENTION

The problems outlined above are in large part solved by the technique hereof for fabricating a transistor having silicon nitride ("nitride") sidewall spacers formed laterally adjacent to the opposed sidewall surfaces of the gate conductor. More particularly, formation of the nitride spacers involves CVD deposition of nitride from a high density plasma ("HDP") source. The high density plasma contains a relatively high concentration of ions (more than approximately $10^{11}$ ions/cm$^3$) and excited atoms. Consequently, diatomic nitrogen ($N_2$) and silane ($SiH_4$) may be used as the reactants for producing the nitride. Otherwise, it would be necessary to use ammonia ($NH_3$) to supply nitrogen since $N_2$ has a relatively low dissociation rate. Since ammonia is not the source of nitrogen, hydrogen radicals are mainly provided from the silane. The probability of hydrogen radicals combining with silicon radicals to form relatively weak Si—H bonds is therefore reduced.

The flux and energy of the reactive species is strictly controlled such that a stoichiometric nitride is produced in a heterogeneous surface reaction Moreover, the high density plasma is controlled such that the probability of collisions between electrons and gas molecules is increased, leading to in an increase in the rate of dissociation, excitation, and ionization of the gas molecules. The resulting radicals and ions are quickly moved in close proximity to the surface of the semiconductor topography so as to promote adsorption of radicals on the surface before gas-phase nucleation can occur. Thus, formation of particulates in the gas phase which could contaminate the nitride is less likely. The deposition rate of the nitride is relatively high, resulting in a decrease in the deposition duration required to form a pre-defined thickness of nitride such that the semiconductor topography may be exposed to ion bombardment for a shorter period of time. Consequently, surface damage of the semiconductor substrate and the gate conductor is reduced.

In one embodiment, a transistor is formed by first thermally growing an oxide layer across a semiconductor substrate. Polysilicon is then deposited across the oxide layer, and portions of the polysilicon and oxide layer are removed to define a gate conductor and gate oxide interposed between a pair of opposed sidewall surfaces. A relatively light dopant concentration is implanted into regions of the semiconductor substrate not covered by the masking gate conductor. In this manner, LDD areas are formed within the semiconductor substrate which are self-aligned to the sidewall surfaces of the gate conductor. Subsequently, nitride is CVD deposited from at high density plasma source across exposed regions of the substrate and the gate conductor.

Prior to nitride deposition, the semiconductor topography is positioned within a reactor chamber in which a high density plasma is produced. The chamber may be pumped down to a relatively low pressure of less than approximately 10 millitorr in preparation for the generation of a high density plasma. A nitrogen containing molecule, preferably $N_2$, and silane, i.e., a source of Si, may be passed into the reaction chamber as the high density plasma is being produced. Accordingly, the plasma contains silicon and nitrogen ions and radicals which become deposited upon the semiconductor topography. One type of high density plasma reactor is the inductively coupled plasma ("ICP") reactor. An ICP reactor known as the Novellus SPEED™ HDP system is commercially available from Novellus Systems, Inc. in Calif. U.S. Pat. No. 5,405,480, which is incorporated by reference as if fully set forth herein, describes such an ICP reactor. The plasma is created inside a vacuum chamber using an induction coil powered by a relatively low frequency RF generator. The ion density of the plasma may be controlled by adjusting the low frequency RF power. A relatively high frequency RF generator may be connected to the platform upon which the wafer resides during the HDP deposition. The ion energy may be controlled by regulating the bias voltage created at the wafer by the high frequency RF generator. Alternately, the high density plasma may be generated using an electron cyclotron resonance ("ECR") reactor. The plasma is generated by introducing a microwave discharge into the ECR chamber. The plasma is subjected to an ECR magnetic field in order to enhance the probability that electrons will collide with the gas molecules. A primary magnetic field may be used to move the plasma in close proximity to the semiconductor topography. A secondary magnetic coil may be positioned near the topography to control the flow of the ions and radicals.

The resulting nitride is anisotropically etched for a duration adequate to form nitride spacers to a pre-defined lateral thickness upon the sidewall surfaces of the gate conductor. The resulting nitride spacers are substantially hydrogen free and oxygen free. An ion implantation which is self-aligned to exposed lateral edges of the spacers may then be used to form heavily doped source/drain regions which are laterally spaced from the channel. An interlevel dielectric may then be CVD deposited across the resulting transistor and semiconductor substrate. The interlevel dielectric may comprise a single oxide layer or an oxide layer arranged upon a thin oxynitride layer. A contact opening may be etched through the interlevel dielectric down to the gate conductor or to a source/drain junction. An etch technique which is highly selective to oxide and oxynitride may be used to form the contact opening. Thus, even if the, photoresist masking layer formed above the interlevel dielectric is mis-aligned such that regions of the interlevel dielectric directly above the nitride spacers are exposed, the high quality nitride spacers will not undergo removal. A conductive material, e.g., tungsten or titanium may be deposited into the contact opening to form a contact to the transistor which may be subsequently coupled to, e.g., a local interconnect. The presence of the high quality HDP nitride spacers (i.e., spacers pure of selectively etched oxygen/oxide molecules) prevent the nitride from being deleteriously removed and conductive material from being deposited in regions directly laterally adjacent to the gate conductor where they could render the transistor inoperable. Furthermore, migration or hydrogen atoms from the spacers into adjacent areas of the transistor is minimized. Thus, the probability that undesirable shifts in the threshold voltage of the transistor will occur.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
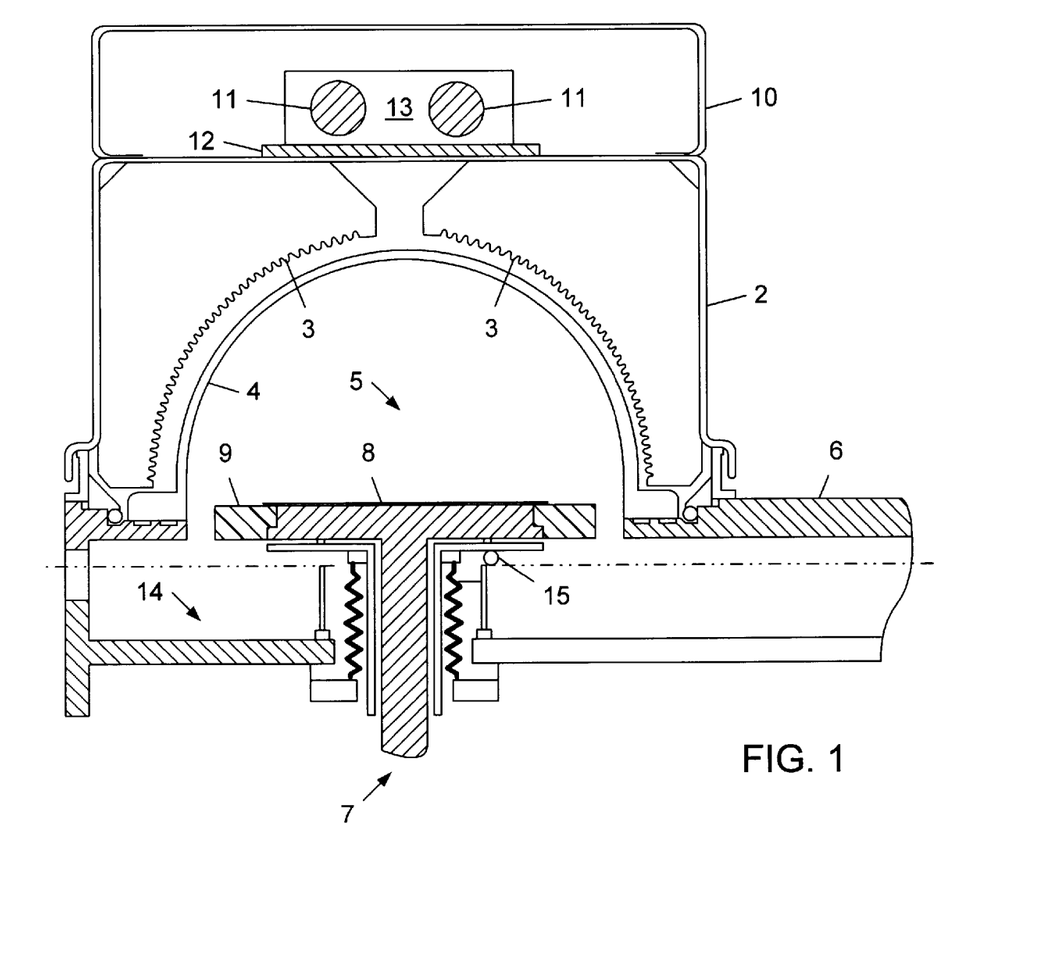
FIG. 1 is a side plan view of an ICP reactor which may be used to create a high density plasma according to one embodiment of the present invention.

Turning now to the drawings, FIG. 1 illustrates an exemplary ICP reactor which may be used to deposit nitride from a high density plasma according to one embodiment of the present invention. The ICP reactor includes a housing 2 mounted onto a top plate 6. An induction coil 3 is positioned within housing 2 about a vacuum chamber 5 which is contained within a quartz vessel 4. Preferably, vessel 4 is hemispherically shaped to provide balanced coupling of RF into vacuum chamber 5. An electrically conductive wafer support pedestal 7 is arranged at the base of chamber 5 which includes a movable platen 9 for holding a semiconductor topography 8. A vacuum system may be connected to a transfer region 14 for evacuating chamber 5, and process gas may be furnished to the chamber through port 15. The ICP reactor also includes an RF generator subsystem having matching capacitors 11 which each have one terminal screwed into a copper bus bar 13. Bus bar 13 is mounted onto a dielectric block 12 which is attached to housing 10. Induction coil 3 is coupled to the RF matching network capacitors 11, and bus bar 13 is connected to a low frequency RF source.

Figure 2:
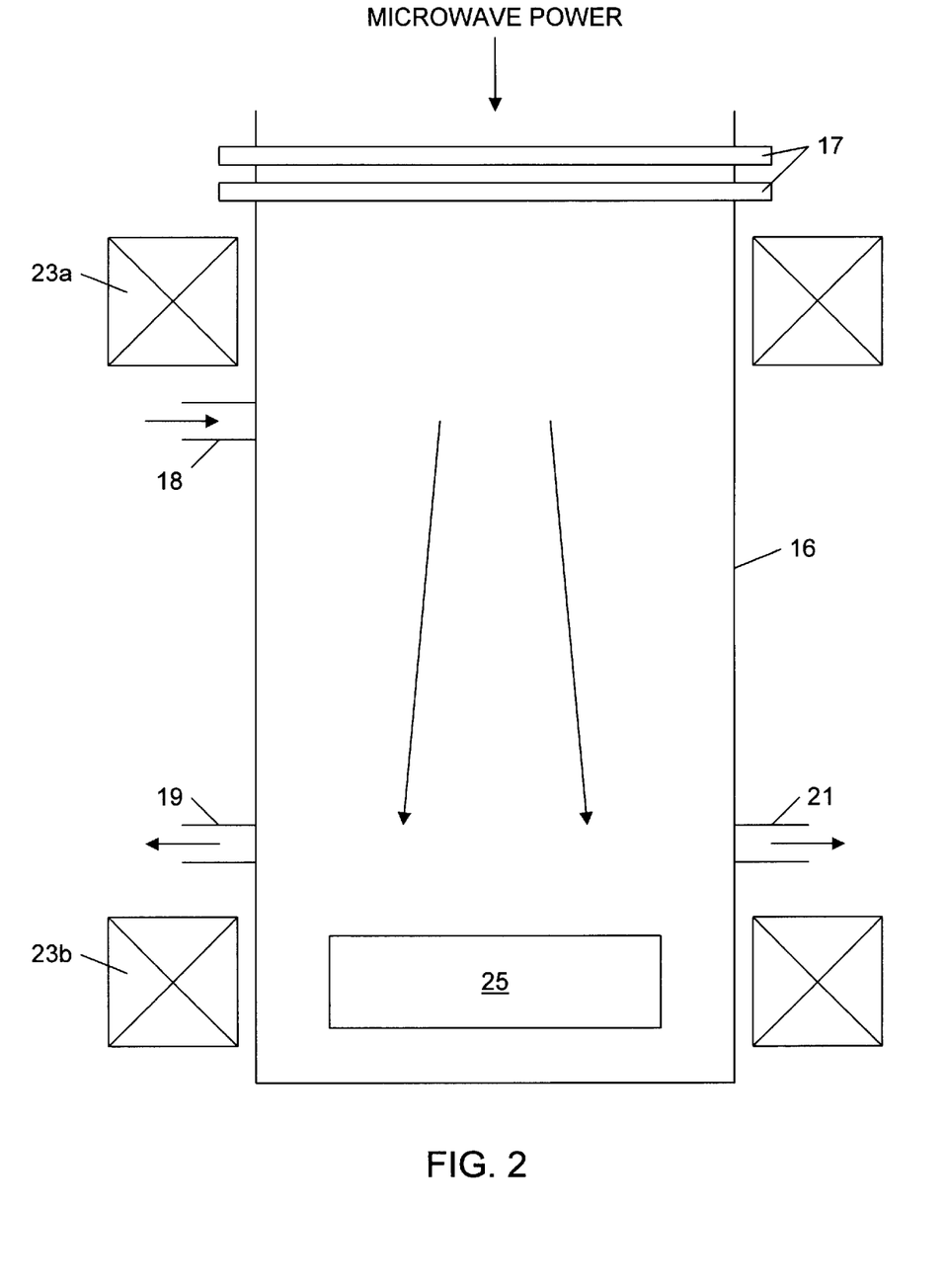
FIG. 2 is a side plan view of an ECR reactor which may be used to create a high density plasma according to another embodiment of the present invention.

FIG. 2 depicts an ECR reactor which may be used for the deposition of nitride during processing of an integrated circuit according to another embodiment of the present invention. The ECR reactor includes a housing 16 having a quartz window 17, a gas inlet port 16, and outlet ports 19 and 21 which are connected to a gas pump and a gas analyzer, respectively. A movable platen 25 is disposed within the reactor near the base of housing 16. A wafer comprising a semiconductor topography may be positioned upon platen 25 such that topological features on the wafer protrude upward. A movable primary magnetic field 23a surrounds housing 16. Magnetic field 23a may be used to move a plasma generated in the reactor toward platen 25 so that excite,d atoms within the plasma can be deposited upon the wafer. A secondary magnetic field 23b is preferably disposed around housing 16 adjacent to platen 25 to control the flow of the generated plasma.

Figure 3:
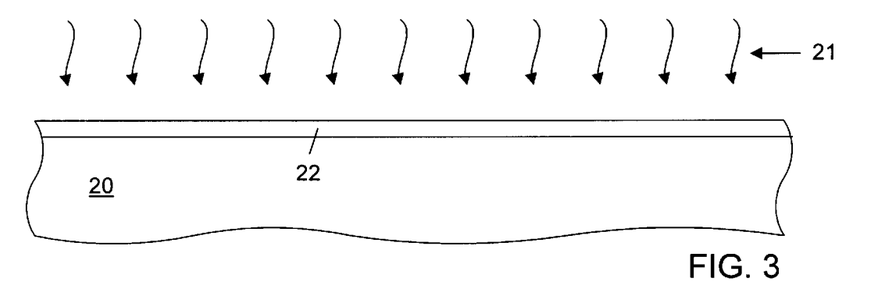
FIG. 3 is a cross-sectional view of a semiconductor topography, wherein a gate oxide is thermally grown across a semiconductor substrate.
Figure 4:
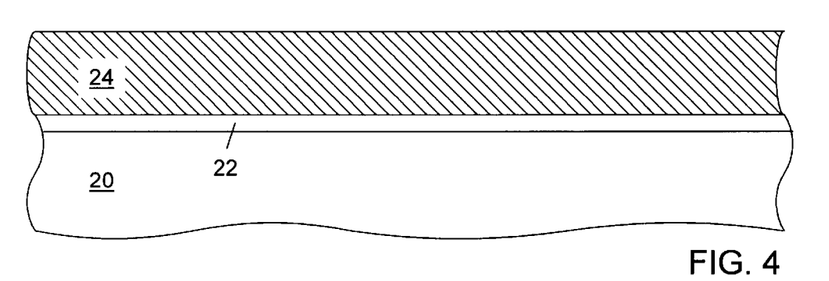
FIG. 4 is a cross-sectional view of the semiconductor topography, wherein a polysilicon gate conductor is deposited across the gate oxide, subsequent to the step in FIG. 3.
Figure 5:
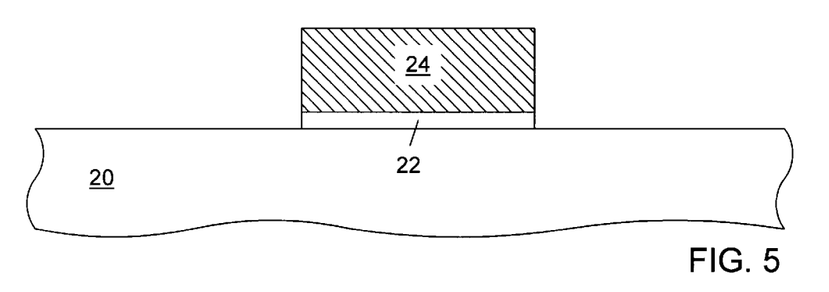
FIG. 5 is a cross-sectional view of the semiconductor topography, wherein portions of the gate oxide and polysilicon gate conductor are removed to define a pair of opposed sidewall surfaces for the gate conductor, subsequent to the step in FIG. 4.

Turning to FIG. 3, a semiconductor substrate 20 is provided which may comprise single crystalline silicon. Although not shown in the depicted cross-section of substrate 20, dielectric isolation regions, such as trench isolation structures may be arranged spaced distances apart within the substrate for dielectrically isolating ensuing active areas. A gate dielectric 22 comprising e.g., oxide may be thermally grown across substrate 20 by subjecting the substrate to thermal radiation 21 at a temperature of greater than about 700° C. while in an oxygen bearing ambient. As shown in FIG. 3, a polysilicon gate conductor 24 may be formed across gate dielectric 22 by using CVD of polysilicon from e.g., a silane source. FIG. 4 depicts the removal of portions of gate dielectric 22 and polysilicon gate conductor 24 down to the surface of semiconductor substrate 20, thereby defining a pair of opposed sidewall surfaces for gate conductor 24. Removal of those portions of gate dielectric 22 and gate conductor 24 may be achieved by using optical lithography to define a photoresist masking layer across those portions followed by e.g., a dry, plasma etch. Etch duration is chosen to terminate before substantial portions of substrate 20 are removed. As shown in FIG. 5, an LDD implant may then be forwarded to semiconductor substrate 20. The LDD implant is aligned to the opposed sidewall surfaces of gate conductor 24, and thereby leads to the formation of LDD areas 26 within regions of substrate 20 not masked by the gate conductor and exclusive of isolation regions. The LDD areas 26 preferably contain a light concentration of dopants that are opposite in type to the dopants implanted within the bulk of substrate 20.

Figure 6:
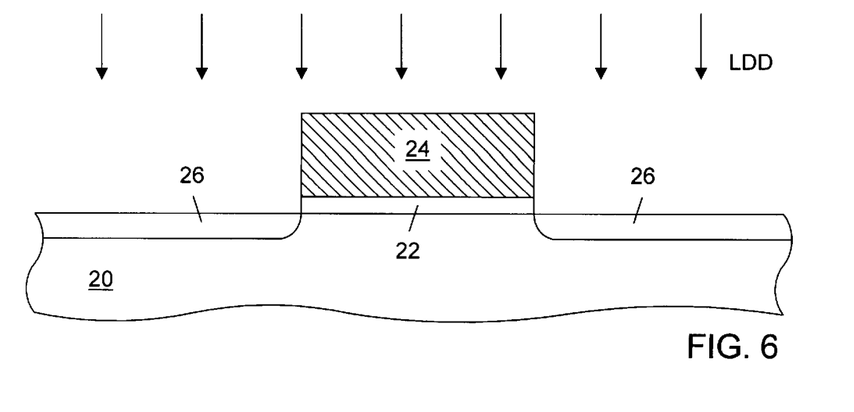
FIG. 6 is a cross-sectional view of the semiconductor topography, wherein an LDD implant which is self-aligned to the sidewall surfaces of the gate conductor is forwarded to the substrate, subsequent to the step in FIG. 5.

Turning to FIG. 6, nitride 28 is then CVD deposited to a thickness of approximately 300 Å to 2000 Å from a high density plasma source across exposed regions of substrate 20 and gate dielectric 24. In one embodiment, the high density plasma deposition may be performed using the ICP reactor depicted in FIG. 1. The semiconductor topography is placed upon platen 9 in preparation for the nitride deposition. Gas within chamber 5 is evacuated through transfer region 60 using a vacuum system. An inert gas, e.g., Ar, may be passed into chamber 5 through port 15 to establish a low pressure less than about 10 mTorr within the reactor chamber. Induction coil 18 is powered by a low frequency (e.g., 450 KHz) RF generator which is connected to coil 18 via a low frequency matching network comprising capacitors 11. The low frequency matching network may be tuned to couple low frequency RF energy into chamber 4 for the production of a high density plasma having approximately $10^{11}$ ions/cm$^3$. A process gas bearing a nitrogen-containing molecule, preferably N$_2$, and a silicon-containing molecule, preferably SiH$_4$, is passed into the plasma. A high frequency (e.g., 13.56 MHz) RF generator is connected to platen 9 by an autotune high frequency matching network. The high frequency matching network includes an internal dc bias control that allows a regulated bias voltage to be achieved at wafer 8. In response to the bias voltage, nitrogen and silicon radicals contained within the plasma become deposited upon the semiconductor topography where they react to form nitride.

In an alternate embodiment, the ECR reactor shown in FIG. 2 may be used to deposit nitride 28. Prior to the nitride deposition, the semiconductor topography is positioned upon platen 25 and the pressure within the reactor is decreased to below approximately 10 millitorr while the temperature is increased to between approximately 100° C. and 400° C. A gas comprising a nitrogen-containing molecule, preferably N$_2$, is then injected into the chamber through inlet port 18. A microwave di charge is introduced into the reactor via quartz window 17, and a plasma is formed in the vicinity of the primary magnetic field coil 23a where an ECR condition is established. The primary magnetic field coil 23a may be moved toward platen 25 so as to compel the plasma toward the semiconductor topography. Silane may then be injected into the excited plasma or the afterglow thereof in order to produce ions and highly reactive radicals from the silane and the N$_2$. The ECR magnetic field is applied to the plasma at a relatively high frequency greater than approximately 1 GHz such that the plasma comprises more than approximately $10^{11}$ ions/cm$^3$. By adjusting the secondary coil 23b, control is exerted over the plasma such that the energy and flux of the ions and electrons are regulated. In this manner, the nitrogen and silicon radicals are deposited upon the surface of the semiconductor topography where they react to form a substantially stoichiometric nitride which is free of contaminants, such as hydrogen and oxygen.

Figure 7:
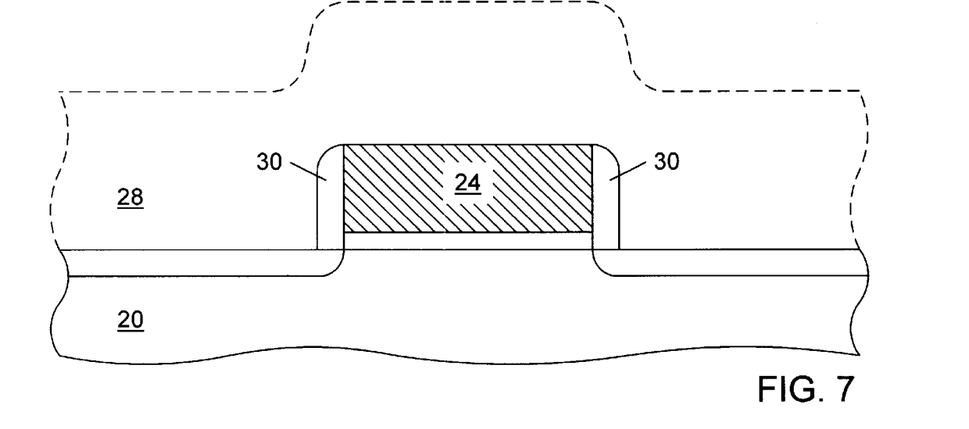
FIG. 7 is a cross-sectional view of the semiconductor topography, wherein nitride sidewall spacers are formed laterally adjacent to the gate conductor, subsequent to the step in FIG. 6.
Figure 8:
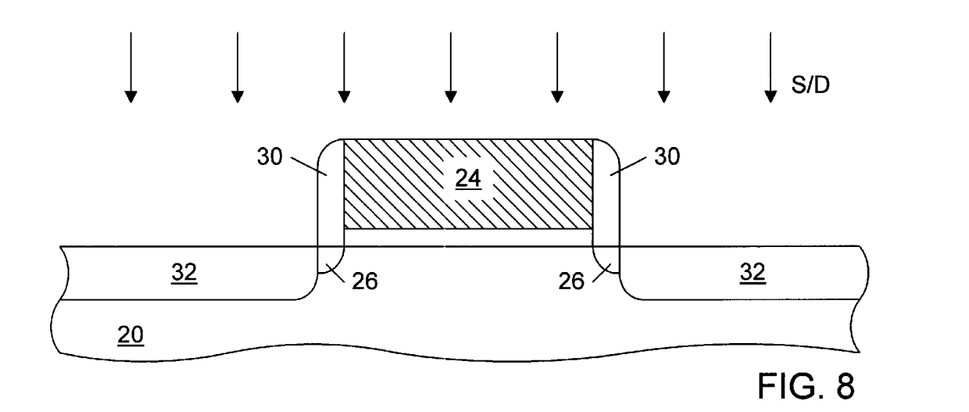
FIG. 8 is a cross-sectional view of the semiconductor topography, wherein a source/drain implant which is self-aligned to the exposed lateral edges of the nitride spacers is forwarded to the substrate, subsequent to the step in FIG. 7.

As shown in FIG. 6, portions of nitride 28 may be removed to form nitride sidewall spacers 30 directly adjacent to the opposed sidewall surfaces of gate conductor 24. The removal of nitride 28 may be accomplished using an anisotropic etch in which ion bombardment of the nitride occurs at a faster rate in a vertical direction than in a horizontal direction. The anisotropic etch may be performed until a pre-defined lateral thickness of nitride 28 remains exclusively adjacent to the sidewall surfaces of gate conductor 24. Turning to FIG. 7, a heavy concentration source/drain (S/D) implant is then self-aligned to the exposed lateral surfaces of nitride spacers 30. During this implantation step, dopants are also forwarded into gate conductor 24 such that the conductivity of the gate conductor is increased.

The dopants used for the S/D implant are of the same type as those used for the LDD implant. Preferably, if a PMOSFET transistor is being formed, ion implantation of p-type species is performed. On the other hand, if an NMOSFET transistor is being formed, n-type species are implanted into substrate 20. Some commonly used n-type dopants are arsenic or phosphorus, and some commonly used p-type dopants are boron or boron difluoride. The resulting transistor has graded junctions in which dopant concentration increases laterally in a direction away from gate conductor 24. In other words, source/drain regions 32 are formed within semiconductor substrate 20 which are more heavily concentrated with dopants than LDD areas 26.

Figure 9:
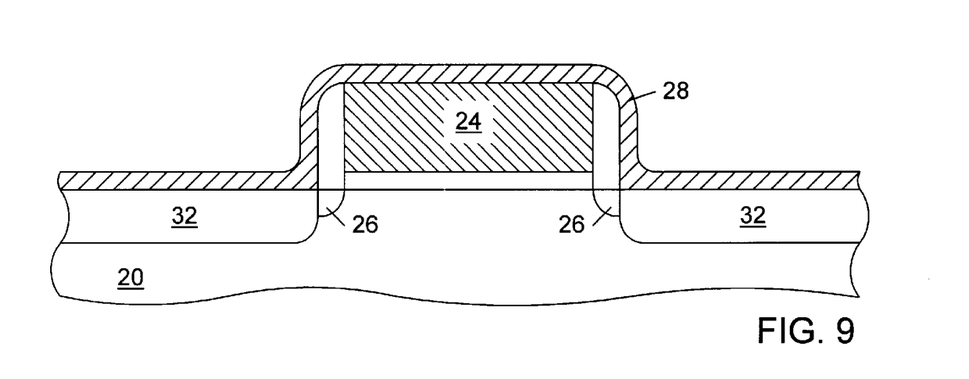
FIG. 9 is cross-sectional view of the semiconductor topography, wherein a refractory metal is deposited across exposed surfaces of the topography, subsequent to the step in FIG. 8.

As illustrated in FIG. 7, a refractory metal 28, e.g., titanium or cobalt, may be formed across exposed surfaces of gate conductor 24, nitride spacers 28, and substrate 20. Refractory metal 28 may be sputter deposited from a metal target or MOCVD ("metal organic" CVD) deposited from a source comprising a volatile metal organic compound. Turning to FIG. 9, a metal salicide 36 (self-aligned silicide) may then be formed exclusively upon exposed regions of substrate 20 and gate conductor 24. Metal salicide 36 may be formed by exposing refractory metal 28 to a form of radiation 34 capable of increasing the temperature of the refractory metal. Radiation 34 may be thermal radiation provided from a heated furnace. Alternately, radiation 34 may be radiant light supplied from e.g., an arc lamp or a tungsten-halogen lamp using a technique known as rapid thermal processing ("RTP"). The use of RTP to heat refractory metal 34 may reduce the amount of unwanted dopant diffusion into the semiconductor topography as compared to using a high temperature furnace. Raising the temperature of refractory metal 34 serves to initiate reaction between metal atoms and silicon atoms of polysilicon gate conductor 24 and substrate 20. Any unreacted refractory metal which remains may be etched away using e.g., a wet etch highly selective to the metal. The resulting metal salicide 36 has a relatively low resistivity and serves as a self-aligned contact region across source/drain regions 32 and gate conductor 24.

Figure 10:
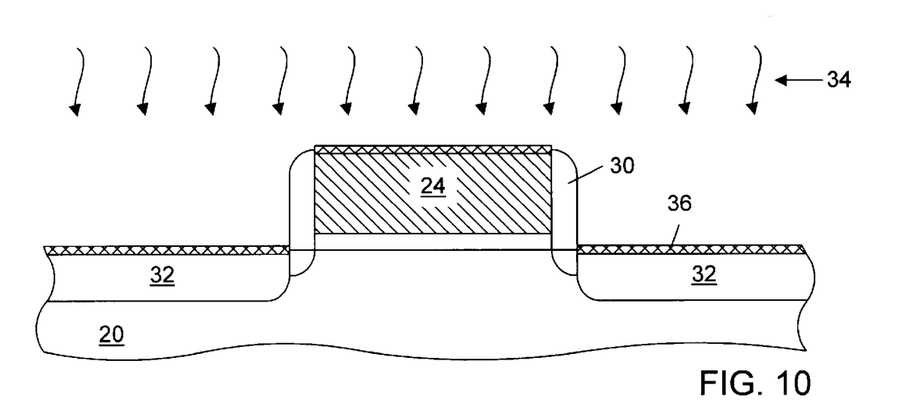
FIG. 10 cross-sectional view of the semiconductor topography, wherein a metal salicide is formed upon the gate conductor and the source/drain regions of the substrate, subsequent to the step in FIG. 9.
Figure 11:
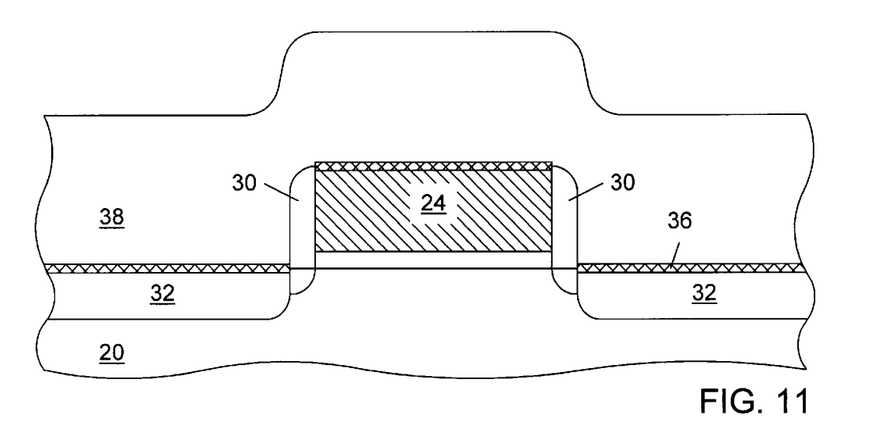
FIG. 11 is a cross-sectional view of the semiconductor topography, wherein an interlevel dielectric is deposited across the exposed surfaces of the topography, subsequent to the step in FIG. 10.
Figure 12:
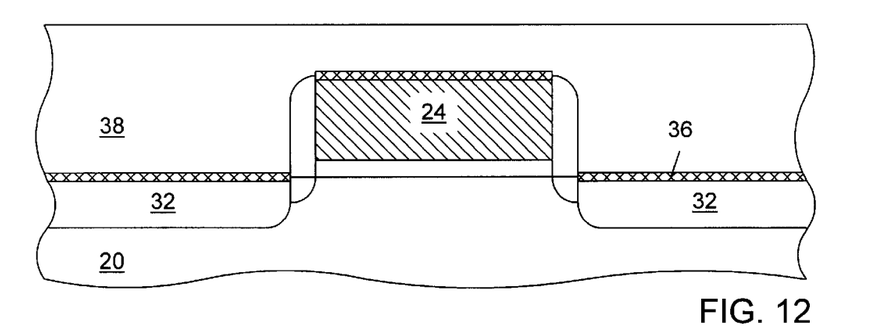
FIG. 12 is a cross-sectional view of the semiconductor topography, wherein the upper surface of the interlevel dielectric is planarized, subsequent to the step in FIG. 11.

FIG. 10 depicts an interlevel dielectric 38 being CVD deposited across exposed surfaces of metal salicide 36 and nitride spacers 30. Interlevel dielectric 38 may comprise, for example, a single oxide layer or an oxynitride layer combined with an overlying oxide layer. As shown in FIG. 11, the upper surface of interlevel dielectric 38 may be planarized using e.g., chemical-mechanical polishing. FIG. 12 depicts the formation of a contact opening 40 through interlevel dielectric 38 such that the metal salicide 36 disposed across gate conductor 24 is exposed. A portion of interlevel dielectric 38 may be etched away to form contact opening 40 using e.g., an etch technique which is highly selective to the interlevel dielectric 38 material. The photoresist masking layer used to define the portion of interlevel dielectric 38 to be etched has been mis-aligned such that contact opening 40 is shifted leftward from its targeted location. Although not intentional, opening 40 may unfortunately be slightly mis-aligned to allow a portion of spacer 30 to be exposed adjacent metal salicide 35. Fortunately, since sidewall spacers 30 are composed of nitride, the etchant used to remove oxide-based interlevel dielectric 38 does not substantially attack the nitride-based spacers.

Figure 13:
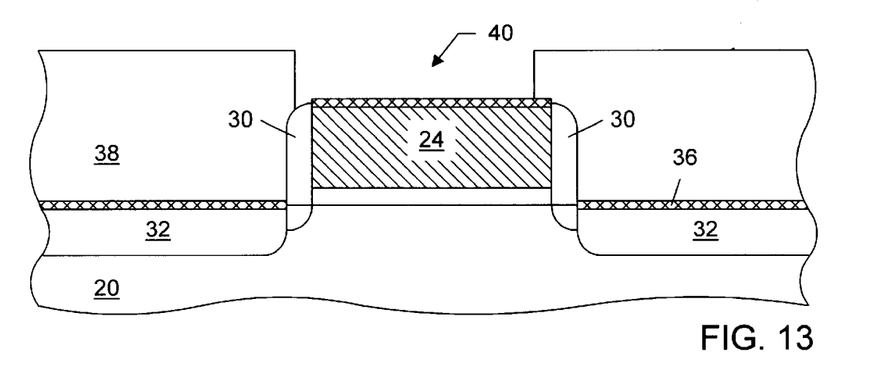
FIG. 13 is a cross-sectional view of the semiconductor topography, wherein a slightly misaligned contact opening is shown etched down to the gate conductor and partial nitride spacer, subsequent to the step in FIG. 12.
Figure 14:
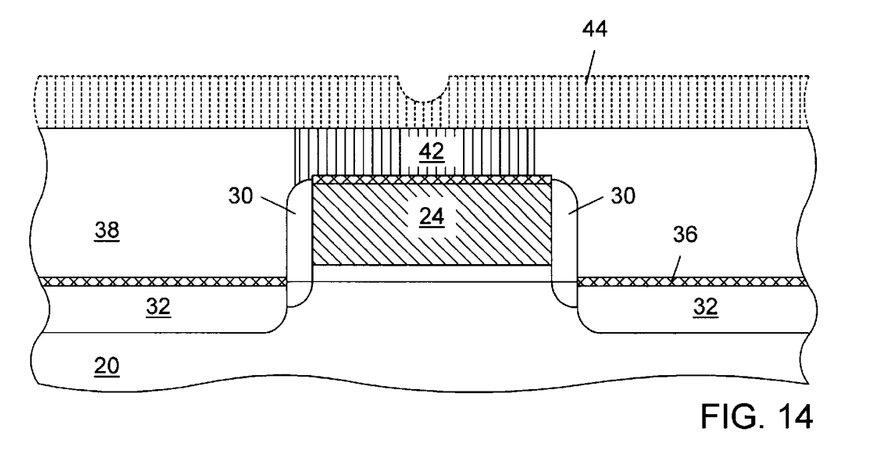
FIG. 14 is a cross-sectional view of the semiconductor topography, wherein a conductive contact is formed within the contact opening, subsequent to the step in FIG. 13.

FIG. 13 depicts the formation of a conductive contact 42 within the contact opening. A conductive material 44, such as tungsten or titanium may be sputter deposited or MOCVD deposited into the contact opening and across interlevel dielectric 38. Conductive material 44 may then be removed down to a level commensurate with the upper surface of interlevel dielectric 38 such that the upper surface of contact 42 is even with that of the interlevel dielectric. A local interconnect comprising e.g., polysilicon may subsequently be formed across interlevel dielectric 38 such that it is coupled to contact 42. Alternately, conductive material 44 may be allowed to remain above interlevel dielectric 38 to serve both as a contact and a local interconnect. The presence of nitride spacers 30 advantageously prohibits contact 42 from extending into the region directly adjacent to the sidewall surfaces of gate conductor 24, thereby reducing the possibility of a conductive path forming between gate conductor 24 and adjacent S/D regions 32.

It will be appreciated to those skilled in the art having the benefit of this disclosure that this invention is believed to provide a method for forming sidewall spacers laterally adjacent sidewall surfaces of a transistor gate conductor, wherein the spacers comprise contaminant-free nitride deposited from a high density plasma source. Further modifications and alternative embodiments of various aspects of the invention will be apparent to those skilled in the art in view of this description. It is intended that the following claims be interpreted to embrace all such modifications; and changes and, accordingly, the specification and drawings are to be regarded in an illustrative rather than a restrictive sense.

What is claimed is:

1. A method for forming a transistor, comprising:
   providing a gate conductor interposed between a pair of opposed sidewall surfaces and dielectrically spaced above a semiconductor substrate;
   depositing silicon nitride from a high density plasma source directly over said gate conductor; and
   etching away a portion of said silicon nitride to form nitride spacers adjacent said pair of opposed sidewall surfaces.

2. The method of claim 1, wherein said etching comprises anisotropic etching said silicon nitride at a faster rate in a vertical direction than in a horizontal direction.

3. The method of claim 1, wherein said depositing comprises introducing microwave radiation to a gas and concurrently applying an electron cyclotron resonance magnetic field to said gas to generate said high density plasma source.

4. The method of claim 1, wherein said depositing comprises generating a first radio frequency power source connected to an induction coil partially surrounding a gas to generate said high density plasma source, and concurrently generating a second radio frequency power source connected to a plate upon which said substrate is arranged to form a dc bias voltage at said substrate.

5. The method of claim 3 or 4, wherein said gas comprises silane, and a nitrogen-containing molecule.

6. The method of claim 4, wherein said molecule nitrogen-containing molecule comprises $N_2$.

7. The method of claim 1, wherein said high density plasma source comprises greater than approximately $10^{11}$ ions per $cm^3$.

8. The method of claim 1, wherein said silicon nitride is substantially free of hydrogen and oxygen atoms.

9. The method of claim 1, wherein said depositing is performed at a pressure below approximately 10 millitorr.

10. The method of claim 1, further comprising implanting a first dopant self-aligned to said pair of sidewall surfaces into said semiconductor substrate to form source and drain regions prior to said depositing.

11. The method of claim 10, further comprising implanting a second dopant self-aligned to exposed lateral surfaces of said nitride spacers subsequent to etching said silicon nitride.

12. The method of claim 11, further comprising forming a dielectric layer across said gate conductor and said semiconductor substrate, and selectively etching a contact opening through said dielectric layer down to an upper surface of said gate conductor without removing said nitride spacers.

13. The method as recited in claim 1, wherein the semiconductor substrate extends across the entirety of a wafer and comprises a first region and a second region, wherein the gate conductor is arranged above the first region, and wherein said depositing comprises the silicon nitride directly upon the gate conductor and above the entirety of the second region.

* * * * *